US010753964B2

(12) United States Patent
Dix et al.

(10) Patent No.: US 10,753,964 B2
(45) Date of Patent: Aug. 25, 2020

(54) CURRENT SENSING FOR INTEGRATED CIRCUIT DEVICES

(71) Applicant: Microchip Technology Incorporated, Chandler, AZ (US)

(72) Inventors: Greg Dix, Tempe, AZ (US); Philippe Deval, Lutry (CH)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 218 days.

(21) Appl. No.: 15/960,848

(22) Filed: Apr. 24, 2018

(65) Prior Publication Data
US 2018/0313874 A1    Nov. 1, 2018

Related U.S. Application Data

(60) Provisional application No. 62/490,963, filed on Apr. 27, 2017.

(51) Int. Cl.
*G01R 19/10* (2006.01)
*G01R 19/00* (2006.01)
(Continued)

(52) U.S. Cl.
CPC ......... *G01R 19/10* (2013.01); *G01R 19/0092* (2013.01); *G05F 3/262* (2013.01);
(Continued)

(58) Field of Classification Search
CPC combination set(s) only.
See application file for complete search history.

(56) References Cited

U.S. PATENT DOCUMENTS 5,408,141 A * 4/1995 Devore ............... H01L 27/0248
257/341
5,867,014 A * 2/1999 Wrathall ............ G01R 19/0092
323/315
(Continued)

FOREIGN PATENT DOCUMENTS

CN    104422810 A    3/2015    ............. G01R 19/00
CN    105720055 A    6/2016    ........... H01L 27/085
(Continued)

OTHER PUBLICATIONS

"AN10322: Current Sensing Power MOSFETS," Rev. 02, NXP Semiconductors, 10 pages.
(Continued)

*Primary Examiner* — Daniel R Miller
(74) *Attorney, Agent, or Firm* — Slayden Grubert Beard PLLC

(57) ABSTRACT

An integrated circuit device for controlling and sensing electrical current is provided. The integrated circuit device comprises a main transistor device, configured for controlling a main current, and a plurality of sensing transistor devices, configured for controlling a combined sensing current. The main transistor device and the plurality of sensing transistor devices are connected to a common gate node. The on-state resistance of the main transistor device is lower than a combined on-state resistance of the plurality of sensing transistor devices. The sensing transistor devices are distributed throughout at least a section of the integrated circuit to reduce an influence of at least one local property of the integrated circuit device on the combined sensing current.

17 Claims, 5 Drawing Sheets

(51) Int. Cl.
*G05F 3/26* (2006.01)
*H03K 17/687* (2006.01)
*H01L 29/78* (2006.01)

(52) U.S. Cl.
CPC ...... *H01L 29/7815* (2013.01); *H03K 17/6871* (2013.01); *H03K 2217/0027* (2013.01)

(56) References Cited

U.S. PATENT DOCUMENTS

| | | | |
|---|---|---|---|
| 6,600,362 B1* | 7/2003 | Gavrila | G05F 3/262 327/427 |
| 7,554,152 B1 | 6/2009 | Ranucci et al. | 257/316 |
| 8,653,583 B2* | 2/2014 | Parthasarathy | H01L 29/7815 257/328 |
| 9,152,163 B1 | 10/2015 | Fabbro et al. | |
| 9,293,535 B2* | 3/2016 | Wang | H01L 29/0696 |
| 9,360,879 B2 | 6/2016 | Levhar et al. | |
| 9,465,057 B2 | 10/2016 | Aerts | |
| 9,973,183 B2* | 5/2018 | Zhu | H03K 5/2472 |
| 10,031,164 B2 | 7/2018 | Takada et al. | |
| 10,388,782 B2 | 8/2019 | Bernacchia et al. | |
| 2012/0187930 A1 | 7/2012 | Williams et al. | 323/273 |
| 2016/0056138 A1 | 2/2016 | Shibib et al. | 257/48 |

FOREIGN PATENT DOCUMENTS

| | | | |
|---|---|---|---|
| CN | 106558583 A | 4/2017 | H01L 27/088 |
| DE | 102015107549 A1 | 11/2015 | G01R 19/00 |
| EP | 0892435 A1 | 1/1999 | H01L 21/336 |
| JP | 3080823 B2 | 8/2000 | G01R 19/00 |

OTHER PUBLICATIONS

DE 102015107549 A1, U.S. Pat. No. 9,152,163 B1.
Hastings, Alan, "The Art of Analog Layout," Pearson Education Asia, Ltd. and Tsinghua University Press: China, pp. 426-442.
German Office Action, Application No. 112018002242.0, 8 pages.
International Search Report and Written Opinion, Application No. PCT/US2018/029389.
Chinese Office Action, Application No. 201880014751.5, 28 pages, dated Apr. 9, 2020.

* cited by examiner

CURRENT SENSING FOR INTEGRATED CIRCUIT DEVICES

RELATED PATENT APPLICATION

This application claims priority to commonly owned U.S. Provisional Patent Application No. 62/490,963 filed Apr. 27, 2017, which is hereby incorporated by reference herein for all purposes.

TECHNICAL FIELD

The present disclosure relates to sensing technology current and, in particular, to current sensing through a power FET device.

BACKGROUND

Integrated circuit devices are widely available to control currents. In particular in the field of power supply, power semiconductor devices or power IC's are employed that allow to control, e.g., switch or regulate, even relatively large currents. These devices may be used for controlling power from as little as some milliwatts in electronics applications up to a gigawatt in power transmission systems. One particular example of a power semiconductor device is a power MOSFET, which e.g., is used in switching-mode power supplies and automotive applications. Power MOSFETs provide high switching speeds and low losses and are thus used for many applications.

For various applications, it is desirable to determine the current, flowing through a power semiconductor device. For example, determining the current may help in avoiding overload situations in connected electronic circuits. With respect to the above exemplary power MOSFETs, so-called Current-sensing power MOSFETs are available that allow to determine the current flow. In these devices, typically a small portion of the FET area is separated to form a pilot or sensing transistor. The pilot transistor's gate is connected to the gate of the main transistor, so that the current flowing through the pilot transistor is an indication of the current flowing through the main transistor when the sense ratio between the main and pilot transistors is known.

SUMMARY

The inventors of this application however determined, that the accuracy of the current measurement in such devices is insufficient for many applications, in particular in high precision applications, such as applications where the accuracy demanded is better than ~5%, and/or where the temperature is not consistent throughout the silicon due to packaging/current distribution. As the inventors have ascertained, sources of inaccuracy include parasitic resistances and thermal effects, inherent to semiconductor devices.

Accordingly, an object exists to provide improved current sensing for integrated circuit devices, and in particular an improved high-precision current-sensing power MOSFET.

In one aspect of the present invention, an integrated circuit device is provided for controlling and sensing electrical current. The integrated circuit device according to this aspect comprising a main transistor device, configured for controlling a main current; and a plurality of sensing transistor devices, configured for controlling a combined sensing current. The main transistor device and the plurality of sensing transistor devices are connected to a common gate node. The on-state resistance of the main transistor device being lower than a combined on-state resistance of the plurality of sensing transistor devices and the sensing transistor devices are distributed throughout at least a section of the integrated circuit to reduce an influence of at least one local property of the integrated circuit device on the combined sensing current.

The basic idea of this aspect of the present invention is to provide an integrated circuit device with a main transistor device for carrying a main electrical current and a plurality of sensing transistor devices, the latter being configured to provide current sensing by coupling the transistor devices at a common gate node. Due to the provision of a plurality, i.e., multiple sensing transistor devices for current sensing and arranging the latter in a distributed way throughout at least a section of the integrated circuit, at least one property, such as a parasitic resistance and a temperature gradient, caused by inhomogeneities in the integrated circuit device, has less influence on the combined sensing current. This arrangement thus enables an improved current measurement, i.e., an improved current sensing. The aforementioned improved current sensing is particularly applicable in MOSFETs, although the current invention is not limited to MOSFETs, but may equally applied to other transistor devices, such as IGBTs, BJTs or thyristors.

The above aspect and other aspects of the invention will be apparent from and elucidated with reference to the embodiments described hereinafter.

DETAILED DESCRIPTION OF EMBODIMENTS

Figure 1:
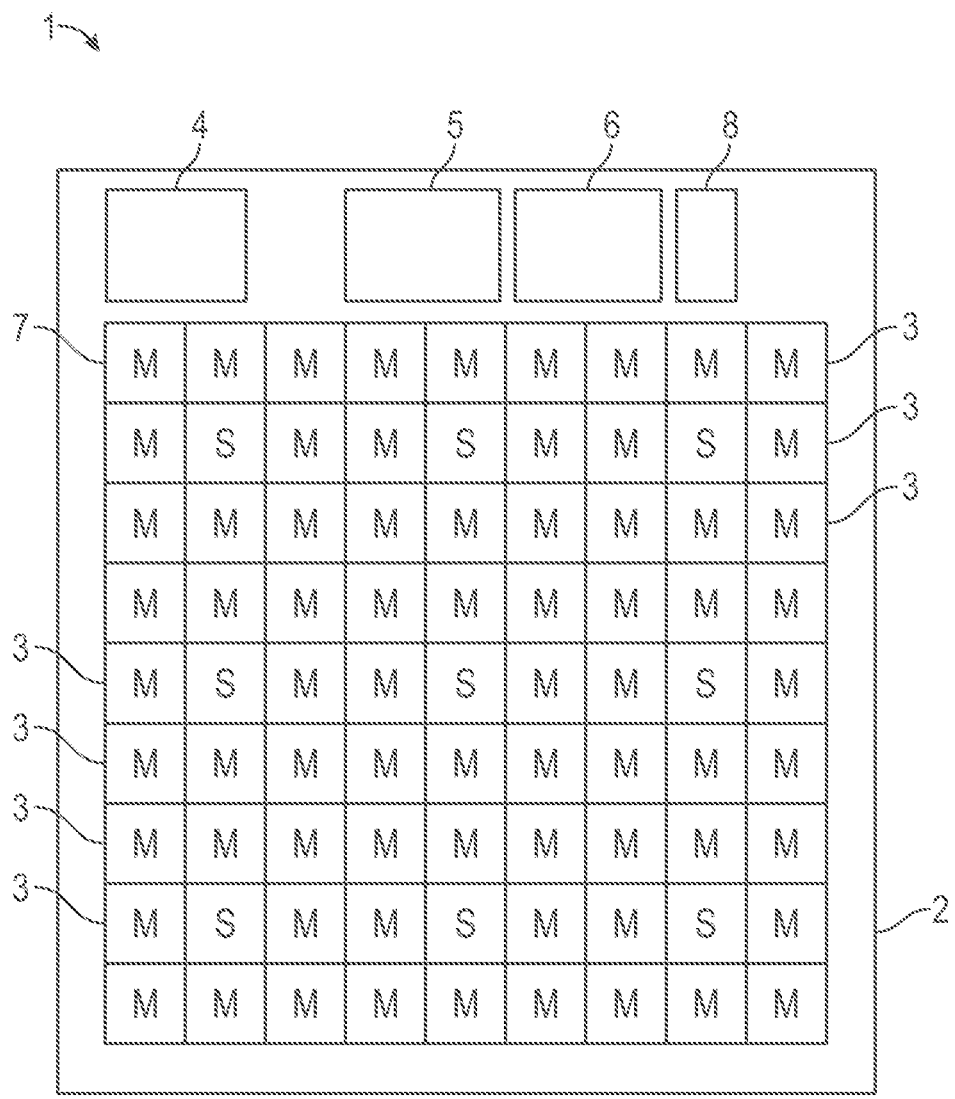
FIG. 1 shows an embodiment of an integrated circuit device in a schematic front view.

Technical features described in this application can be used to construct various embodiments of integrated circuit devices. Some embodiments of the invention are discussed so as to enable one skilled in the art to make and use the invention.

In one aspect, an integrated circuit device for controlling and sensing electrical current is provided. The integrated circuit device according to this aspect comprises a main transistor device and a plurality of sensing transistor devices. The main transistor device is configured to control a main current, while the plurality of sensing transistor devices is configured for controlling a combined sensing current. The main transistor device and the plurality of sensing transistor devices are connected to a common gate node to couple the combined sensing current with the main current. The on-state resistance of the main transistor device is lower than the combined on-state resistance of the plurality of sensing transistor devices. The sensing transistor devices are distributed throughout at least a section of the integrated circuit, which serves to reduce an influence of at least one local property of the integrated circuit device on the combined sensing current.

The integrated circuit device may be of any suitable type to allow controlling electrical current. For example, the integrated circuit device may be a semiconductor device for controlling electrical current. The integrated circuit device comprises at least the main transistor device and the plurality of sensing transistor devices. These devices may be of any suitable type and in one embodiment, may be arranged on a single (semiconductor) die.

In the context of the present invention, the term "transistor device" is understood as a device, comprising at least a single transistor. The transistor device in an embodiment certainly may comprise a plurality of transistors, i.e., a group of transistors. As will be explained in the following in further detail, the main transistor device and/or the sensing transistor devices may in corresponding embodiments be formed from one or more "elementary transistors", which are also referred to in this application as "elementary cell" or "transistor cell".

For example, the transistors/elementary transistors may comprise BJTs, IGBTs, thyristors, FETs (field-effect transistors), e.g., n-MOS, p-MOS, MOSFETs (metal-oxide-semiconductor field-effect transistors), JFETs (junction gate field-effect transistors), or others. Certainly, the transistors may be of the same type or of different types, depending on the respective semiconductor processing method used.

As discussed in the preceding, the main transistor device and the plurality of sensing transistor devices are connected to a common gate node, which common gate node allows to control the transistor devices. Accordingly, and depending on the type of transistor used within the transistor devices, i.e., bipolar or FET, the common gate node is connected either directly or indirectly to each transistor's base or each transistor's gate, respectively. This setup provides that the voltage applied to the common gate node influences both, the main current and the combined sensing current, thereby effectively coupling these currents with each other.

While the main transistor device is configured to, during use, control the main current, the sensing transistor devices are configured to, during use, control the combined sensing current. In terms of the present explanation, the term "combined sensing current" refers to the current, flowing through the plurality of sensing transistors when a corresponding voltage is applied. Certainly, this combined sensing current may be formed by a plurality of individual sensing currents, which are flowing through each of the sensing transistor devices of the provided plurality. For example, in case the plurality of sensing transistor devices are connected in parallel to each other, each of these transistor devices will carry a fraction of the combined sensing current when a voltage is applied, at least in an on-state of the transistor devices, which may be a full on-state or a "partly" on-state.

In an exemplary embodiment using BJTs, the respective current, i.e., main or sensing current, is flowing between collector and emitter of the respective transistor device when a voltage is applied to these terminals of the device. In another exemplary embodiment using FETs, the respective current is flowing between source and drain of the transistor device.

According to the present aspect, the main transistor device is configured with an on-state resistance that is lower and a combined on-state resistance of the plurality of sensing transistor devices. In other words, the maximum current carrying capacity of the main transistor device generally is higher than the overall current carrying capacity of the plurality of sensing transistor devices in view that in particular with high currents, a high on-state resistance may lead to high power dissipation into heat, which may be difficult to remove from the integrated circuit device. In one example of using FET(s) within the transistor devices, the current carrying capacity is generally related to the surface area of the source terminal of the respective FET, so that the FET(s) of the main transistor device in this example has greater surface area source terminal compared to the overall surface area of the source terminals of the plurality of sensing FETs, i.e., the FETs that form the plurality of sensing transistor devices.

In one embodiment, the main transistor device is a power MOSFET device. For example, the power MOSFET device may be configured with a current carrying capacity in the range of 1 to 40 A.

As discussed in the preceding, the integrated circuit device at least comprises the main transistor device and the plurality of sensing transistor devices. Certainly, the integrated circuit device may comprise further circuits, units, modules, or devices, in the following collectively referred to as "components", such as for example op-amps, comparators, regulation circuits, etc. Such additional components may in particular be present in highly integrated circuit devices, such as SoCs, i.e., "system on a chip" devices.

According to the present aspect, the sensing transistor devices are distributed throughout at least a section of the integrated circuit device so as to reduce an influence of at least one local property of the integrated circuit device on the combined sensing current.

As will be apparent, the distribution of the sensing transistor devices throughout at least a section of the integrated circuit generally may level out local properties of the integrated circuit device that may have an influence on the respective sensing current, such as local inhomogeneities, e.g., caused by the semiconductor manufacturing process. In corresponding embodiments, the local property may comprise or be related to one or more of a thermal gradient, a parasitic resistance, and a parasitic capacitance.

In the present context, the term "distributed" relates to a spaced or separated arrangement of the sensing transistor devices to cover at least a section of the integrated circuit device. As mentioned, the distribution serves to level out for example local inhomogeneities of the integrated circuit device.

In one embodiment, the sensing transistor devices of the plurality of sensing transistor devices are distributed evenly throughout the section of the integrated circuit device. Such an "even" distribution may be such that a given number of sensing transistor devices cover a given sub-section. For example, in case of a number of n sensing transistor devices, the section may be divided into n sub-sections, where each of the n sensing transistor devices is arranged in one sub-section. The sensing transistor devices in this embodiment may or may not be equally spaced from each other.

In another alternative or additional embodiment, the sensing transistor devices of the plurality of sensing transistor devices are equally spaced from each other throughout at least the section of the integrated circuit device.

As discussed in the preceding, the sensing transistor devices are distributed throughout at least a section of the integrated circuit device. The section may be any suitable section of the integrated circuit device. In one embodiment, the section is a fraction of the surface area of a (semiconductor) die. For example, the section may be an edge section of the die. In another alternative or additional example, the edge section is a circumferential edge section, surrounding an area of the die, in which the main transistor device is arranged.

In one additional or alternative embodiment, the main transistor device is arranged in a transistor section of the integrated circuit. As discussed in the preceding, this may, e.g., be a defined surface area of the (semiconductor die) in which the transistor(s) of the main transistor device is/are arranged.

In one additional embodiment, the sensing transistor devices of the plurality of sensing transistor devices are distributed throughout at least the transistor portion. The present embodiment provides a further improved current sensing in view that an inhomogeneity, that influences the main current, influences the overall sensing current(s) in the same way. In one embodiment, poly gates are arranged that enclose (isolate) the sources of the transistor(s) of the sensing transistor devices from the transistor(s) of the main transistor device to allow proper separation of the devices. In another embodiment, a trench isolation is arranged, where the transistor device is a trench or vertical FET, and the active trench also isolates a source area from the main transistor's source area.

It is noted however, that various setups are conceivable, which are discussed in detail in the following.

In one further embodiment, the sensing transistor devices are equally spaced throughout at least the transistor section. In another alternative or additional embodiment, the sensing transistor devices are distributed evenly throughout at least the transistor section. Reference is made to the preceding discussion and definition of the terms "equally spaced" and "distributed evenly".

As discussed, the sensing transistor devices of the plurality of sensing transistor devices in one embodiment are distributed throughout at least the transistor portion. Certainly, and in one embodiment, sensing transistor devices may be arranged outside of the transistor portion, for example additionally in edge section of the die or a circumferential edge section, as discussed in the preceding.

In another embodiment, the transistor section comprises a plurality of elementary transistors. At least some of the elementary transistors may in one embodiment be allocated for the main transistor device, i.e., to each carry a corresponding fraction of the main current and/or the plurality of sensing transistor devices, i.e., to each carry a fraction of the combined sensing current. Accordingly, and in another embodiment, at least a first subset of the elementary transistors may form the main transistor device. A plurality of second subsets of the elementary transistors may form the plurality of sensing transistor devices. The elementary transistors of the first subset and the plurality of second subsets may be of the same or different types. In one embodiment, elementary transistors of the first subset and the plurality of second subsets are identical (same width and length). This embodiment provides further improved sensing accuracy. However, in another embodiment the elementary transistors of the first subset and the second subsets may have differing width (W) and/or length (L). Differing width and/or length for elementary transistors of the first subset and the plurality of second subsets may be used in order to provide a higher flexibility for setting the ratio between the main and sensing current, e.g., mainly helping to enlarge this ratio.

An elementary transistor may be of any suitable type, as discussed in the preceding. It is noted that in an exemplary embodiment having FET elementary transistors, each elementary transistor has its own channel. However, the respective elementary transistor may share its gate, its source, its drain, and/or its body with other (elementary) transistors in corresponding embodiments.

The first subset and the plurality of second subsets may comprise any suitable number of elementary transistors. Generally, the first subset may in an embodiment comprise a number of elementary transistors, which is higher than the overall number of elementary transistors of the plurality of second subsets. In one embodiment, the first subset, i.e., the subset, allocated with the main transistor device, comprises at least one thousand elementary transistors. In another alternative or additional embodiment, each of the second subsets comprises less than five elementary transistors, and in particular one or two elementary transistors.

The ratio between the elementary transistors, associated with the main transistor device and the elementary transistors, associated with the plurality of secondary transistor devices may also be referred to as sense ratio or current sensing gain. In one embodiment, the on-state resistance of the main transistor to the (overall) on-state resistance of the plurality of sensing transistor devices is approximately/substantially between 1:1000 and 1:10000. It is noted that the sense ratio in an embodiment may be smaller than 1:10000, in view that for efficiency reasons, the sense ratio may be selected to be small. The sense ratio may however depend on layout and/or electrical constrains of the respective setup of the integrated circuit device. In another embodiment, the sense ration may be higher than 1:1000.

In another embodiment, the integrated circuit device comprises more than two sensing transistor devices. Generally, the larger the number of sensing transistor devices, the better the accuracy of a current measurement may be. Certainly, topographic or technology limitations may apply. According to yet another embodiment, the integrated circuit comprises between 2 and 20 sensing transistor devices.

As discussed in the preceding, the elementary transistors may share source and/or drain. Correspondingly, the main transistor device and the plurality of sensing transistor devices may in corresponding embodiments be connected to one or more of a common drain, a common source, and a main power source. Certainly, these common drain and common source nodes may in corresponding embodiments be connected with the shared source and/or drain terminals of the underlying elementary transistors, for example in a parallel connection.

With respect to common drain and source nodes, multiple setups are conceivable. For example and in one embodiment, the main transistor device and the plurality of sensing transistor devices may be connected to the common drain node and the common source node. This embodiment is also referred to as a fully symmetrical setup in the following. In another embodiment, the main transistor device and the plurality of sensing transistor devices may be connected to the common drain node but have separate source nodes. In a further embodiment, the main transistor device and the plurality of sensing transistor devices may be connected to the common source node but have separate drain nodes.

According to another embodiment, the integrated circuit device comprises a voltage drive circuit configured to set a measurement voltage across the plurality of the sensing transistor devices to a voltage across the main transistor device. The present embodiment allows to measure a current across the plurality of sensing transistor devices and to determine the main current of the main transistor therefrom using the sense ratio.

In one embodiment, the plurality of sensing transistor devices are connected in parallel to each other, so that a common sensing drain node and a common sensing source node are provided, wherein the common sensing drain node is connected to a main drain node of the main transistor device. In this embodiment, the common sensing source node may be separate from a main source node of the main transistor or may be connected thereto. The present embodiment facilitates the setup of the integrated circuit device according to the preceding discussion.

According to another embodiment, the common sensing source node is configured as a first kelvin voltage sensing node and the integrated circuit further comprising a voltage drive circuit configured to set a measurement voltage between the first kelvin voltage sensing node and the common sensing drain node to a voltage across the main transistor device. Alternatively or additionally, and in another embodiment, the main transistor device comprises a main source node, said main source node being configured as a second kelvin voltage sensing node and the voltage drive circuit being configured to set the measurement voltage to a voltage between the second kelvin sensing node and the main drain node.

The first and second kelvin voltage sensing nodes allow a further improved voltage matching across the main transistor device and the plurality of secondary transistor devices by excluding parasitic and varying resistances, external to the integrated circuit device. The resulting setup is comparable to four-terminal sensing, i.e., kelvin sensing, by reducing an influence of voltage drops across external parasitic resistances on the voltage measurement. Also in this embodiment, and once the voltages across the main transistor device and the plurality of secondary transistor devices is matched, it is possible to determine the main current from the comparably smaller combined sensing current.

The preceding arrangement of the plurality of sensing transistor devices having a common sensing drain node and a common sensing source node can be inversed, so that the common sensing source node is connected to a main source node of the main transistor device. In this embodiment, the common sensing drain node may be separate from a main drain node of the main transistor or may be connected thereto.

According to another embodiment, the common sensing drain node is configured as a first kelvin voltage sensing node and the integrated circuit further comprises a voltage drive circuit configured to set a measurement voltage between the first kelvin voltage sensing node and the common sensing source node to a voltage across the main transistor device.

According to another embodiment, the main transistor device comprises a main drain node, said main drain node being configured as a second kelvin voltage sensing node and the voltage drive circuit being configured to set the measurement voltage to a voltage between the second kelvin sensing node and the main source node.

In another embodiment, the integrated circuit device comprises a measurement circuit, wherein the measurement circuit is configured for determining the combined sensing current. The measurement circuit may be of any suitable type. For example, the measurement circuit may comprise a typical high-precision (shunt) resistor device, so that the voltage drop across the resistor device can easily be measured with a high accuracy. In another example, a galvanometer may be used to determine the combined sensing current.

According to another embodiment, the measurement circuit is further configured to determine the main current from the combined sensing current and a predefined sense ratio. The measurement circuit in this embodiment and in addition to the above, may comprise a logic circuit or a microcontroller to determine the main current from the combined sensing current and the predefined sense ratio. The predefined sense ratio may correspond to the sense ratio of the integrated circuit device and may be comprised in memory of a microcontroller or hard-wired into a logic circuit. In view that the sense ratio is determined upon manufacturing of the integrated circuit device, the predefined sense ratio does not necessarily need to be changeable by a user, although an update may be possible to improve the measurement for example for compensation purposes in case of a defect of one or more of the elementary transistors. Accordingly, the logic circuit in one embodiment may be configured to set the sense ratio according to user input or automatically in case a defect is noted.

In another aspect, a method for current measurement in an integrated circuit device is provided. The integrated circuit device comprises a main transistor device and a plurality of sensing transistor devices, the plurality of sensing transistor devices being distributed throughout at least a section of the integrated circuit. The main transistor device and the plurality of sensing transistor devices are connected to a common gate node to couple the combined sensing current with the main current. According to the method of this aspect, a main current is applied to the main transistor device, a combined sensing current, flowing through the plurality of sensing transistor devices is determined, and the main current is calculated from the combined sensing current and a predefined sense ratio.

In one embodiment and before the combined sensing current is determined, a measurement voltage across the plurality of sensing transistor devices is set to a voltage across the main transistor device.

The integrated circuit device and in particular the main transistor device and the plurality of sense transistor devices according to the present aspect and in further embodiments may be configured according to one or more of the embodiments, discussed in the preceding with reference to the preceding aspect. With respect to the terms used for the description of the present aspect and their definitions, reference is made to the discussion of the preceding aspects.

According to another aspect, an integrated circuit device is provided, comprising a main power source, a sensing power source, and a plurality of transistors, the plurality of transistors connected to a common drain and a common gate. A first transistor of the plurality of transistors is connected to the main power source, a remainder of the plurality of transistors is connected to the main power source, and the remainder of the plurality of transistors are configured to, in combination, sense current.

Additionally or alternatively and in another embodiment, the remainder of the plurality of transistors are laid out in a plurality of physical locations in the integrated circuit device.

Additionally or alternatively and in another embodiment, the integrated circuit device further comprises a first voltage sense circuit connected between a pin of the first transistor and the main power source.

Additionally or alternatively and in another embodiment, the integrated circuit device further comprises a second voltage sense circuit connected between pins of the remainder of the plurality of transistors and sensing power source.

Additionally or alternatively and in another embodiment, The integrated circuit device further comprises a voltage drive circuit configured to drive voltage of the sensing power source to a level of the main power source.

Additionally or alternatively and in another embodiment, the integrated circuit device further comprises a voltage drive circuit configured to drive voltage of the sensing power source to a level of the main power source using measurements from:

a first voltage sense circuit connected between a pin of the first transistor and the main power source; and a second voltage sense circuit connected between pins of the remainder of the plurality of transistors and sensing power source.

Additionally or alternatively and in another embodiment, the integrated circuit device further comprises a measurement circuit configured to calculate a current measurement from relative values associated with the main power source and the sensing power source.

Additionally or alternatively and in another embodiment, the integrated circuit device further comprises a measurement circuit configured to calculate a current measurement from resistance associated with the sensing power source.

Reference will now be made to the drawings in which the various elements of embodiments will be given numerical designations and in which further embodiments will be discussed.

Specific references to components, sections, parts, process steps, and other elements are not intended to be limiting. Further, it is understood that like parts bear the same reference numerals, when referring to alternate figures. It is further noted that the figures are schematic and provided for guidance to the skilled reader and are not necessarily drawn to scale. Rather, the various drawing scales, aspect ratios, and numbers of components shown in the figures may be purposely distorted to make certain features or relationships easier to understand.

FIG. 1 shows a schematic front view of a first embodiment of an integrated circuit device 1, namely a power FET, arranged on a semiconductor die 2. The power FET comprises a number of elementary transistors 3, which form elementary cells. To allow carrying relatively high currents, hence the name "power FET", a large number of such elementary transistors 3 are arranged in power FET, typically some thousands of elementary transistors 3 for controlling an electrical current in the range of 1 to 40 amps.

For reasons of clarity, only a 9×9 matrix of elementary cells 3 are shown in the schematic representation of FIG. 1. The elementary cells 3 form a transistor section 7 on the die 2.

Each elementary transistor 3 comprises corresponding gate, source, and drain connections (not shown in FIG. 1) and is configured to setup a conductive channel in dependence of the voltage, applied to a common gate node 4. To allow a common control of the elementary transistors 3, the gate terminal of each of the elementary transistors 3 is connected to the common gate node 4. Furthermore, the elementary cells 3 share a common drain node 5, i.e., the drain terminal (not shown in FIG. 1) of each elementary transistor 5 is connected to the common drain node 5.

In the current embodiment, the power FET has a vertical diffused MOS (VDMOS) FET structure, so that the drain terminals of the elementary transistors 3 are arranged below each of the respective elementary transistors 3, i.e., below the N⁻ region in which each of the transistors during use forms its channel. The source terminals of the elementary transistors are arranged on the opposing side of the vertical FET structure.

To allow an efficient sensing of the electrical current that is flowing through the power FET during use, the elementary cells 3 are "grouped" to form a main transistor device and a plurality of sensing transistor devices. Elementary transistors 3 that form the main transistor device are marked in FIG. 1 with the letter "M", i.e., "main elementary transistors", while elementary transistors 3 that form the plurality of sensing transistor devices are marked with the letter "S", i.e., "sensing elementary transistors". The source terminals of each main elementary transistor 3 is connected with main source node 6. As will be apparent, the resulting parallel connection of the main elementary transistors 3 allows for a relatively high main current to be controlled, in particular when considering that in a typical application, some thousand main elementary transistors 3 are connected in parallel with each other. This arrangement allows for a relatively low on-state resistance, which provides an efficient structure with a low power dissipation.

Figure 2:
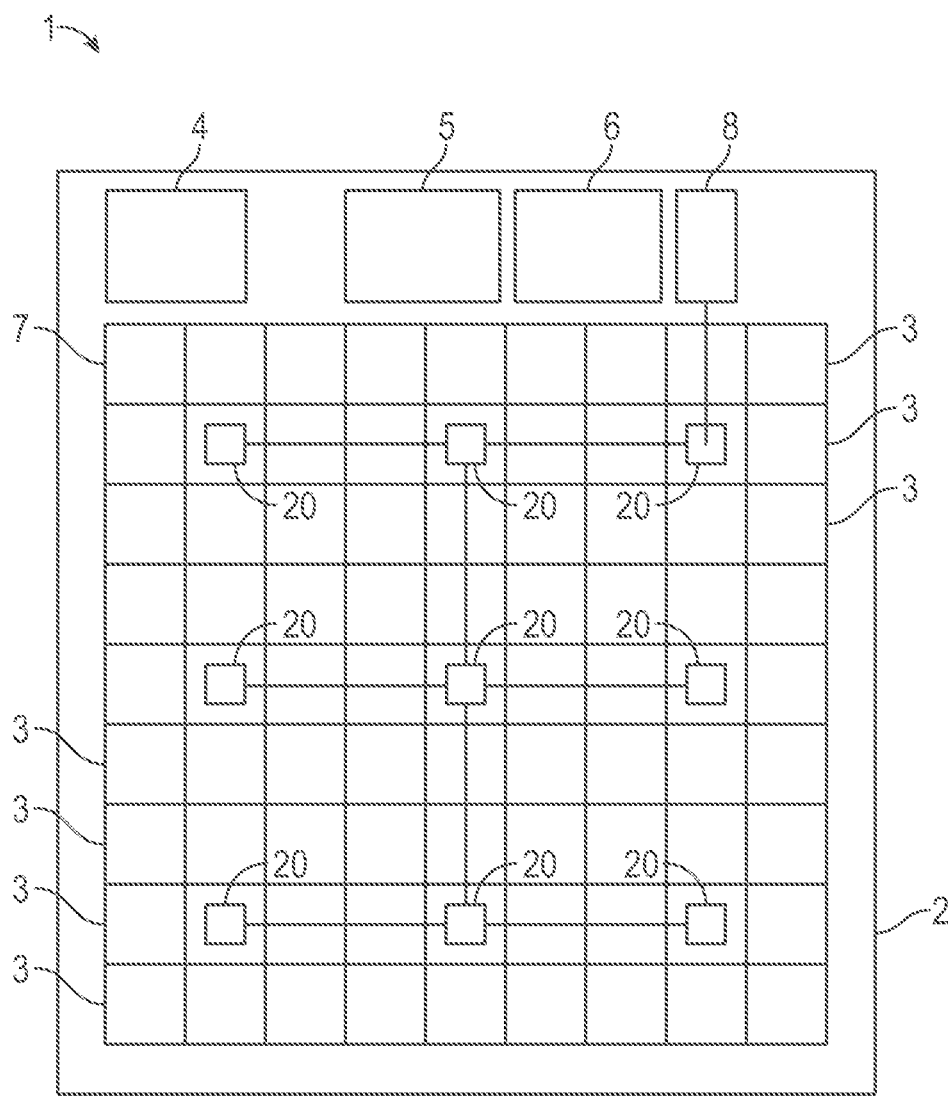
FIG. 2 shows a further schematic view of the embodiment of FIG. 1.

The source terminals 20 of each of the sensing elementary transistors 3 are connected with sensing source node 8. The resulting electrical connections are schematically shown in FIG. 2. Certainly, the number of sensing elementary transistors 3 is significantly smaller than the number of main elementary transistors, so that the on-state resistance the parallel connection of the sensing elementary transistors 3 is higher than the respective on-state resistance of the main elementary transistors 3.

As discussed in the preceding, the main elementary transistors 3 form a main transistor device for controlling an overall main current, while the sensing elementary transistors 3 form a plurality of sensing transistor devices. In the present embodiment, each sensing elementary transistor 3 forms a corresponding sensing transistor device, i.e., one elementary transistor 3 is provided per sensing transistor device. This number may be higher, depending on the application, the topology of the integrated circuit device, and the processing of die 2.

The resulting parallel connection of the sensing elementary transistors 2, that is the parallel arrangement of the sensing elementary transistors 2 between common drain node 5 and sensing source node 8, allows to control a (combined) sensing current. In typical applications, the combined sensing current should be as low as possible. The combined sensing current is indicative of the main current in view that all elementary transistors 3 are connected to common gate node 4. To reduce the influence of inhomogeneities in the semiconductor die 2 that may in particular cause thermal gradients, the sensing transistor devices are distributed evenly throughout the transistor section 7. Accordingly, a local inhomogeneity in the semiconductor die 2 will influence both, the main current, flowing through the main elementary transistors M, and the combined sensing current, flowing through the sensing elementary transistors S, allowing for a highly precise current measurement.

Figure 3:
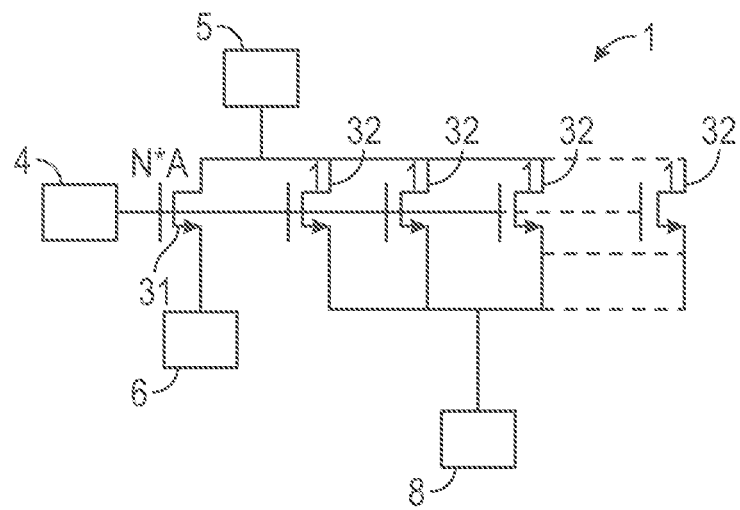
FIG. 3 shows a schematic circuit diagram of the embodiment of FIG. 1.

FIG. 3 shows a simplified and schematic circuit diagram of the embodiment of FIGS. 1 and 2. For reasons of clarity, FIG. 3 only shows the main transistor device 31 and the sensing transistor devices 32, but not the underlying elementary cells/transistors 3. As will be apparent, the main transistor device 31 is connected between common drain node 5 and main source node 6. The plurality of sensing transistor devices 32 are connected in parallel between common drain node 5 and sensing source node 8.

To determine the main current $I_{DS,\,M}$ in the shown setup, first, the voltage across the main transistor device 31, i.e., $V_{DS,\,M}$, is determined. The determined voltage is then applied to the plurality of sensing transistor devices 32 using a voltage drive circuit (not shown), so that $V_{DS,\,S} = (V_{DS,\,M} + V_{off})$. $V_{off}$ should be set as small as possible (ideally zero) in order to minimize the sensing error that is equal to $V_{off}/V_{DS, M}$. As mentioned above, the "on" resistance of the main transistor, thus the voltage drop $V_{DS, M}$ across the main transistor, should to be very low in order to minimize power losses in the device as well as minimizing power dissipation into heat, which may be difficult to remove from the integrated circuit device. Typically, the device is designed to achieve a maximum voltage drop $V_{DS, M}$ in the range of 100–150 mV. Thus, in order to get an accuracy in the range of 1%, the offset voltage $V_{off}$ should to be less than 1 mV. Therefore, a very low offset amplifier like an instrumentation amplifier 60 may be used to control the voltage difference between the main and sensing transistors, as discussed in the following and shown in the embodiment of FIG. 6.

Once the voltages correspond to each other, the combined sensing current through the sensing transistor devices 32 is determined using a measurement circuit (also not shown), i.e., $I_{DS, S}$. Since the sense ratio n, i.e., the ratio on-state resistance of the main transistor device 31 to the on-state resistance of the plurality of sensing transistor devices 32 is generally known from the setup of the integrated circuit, the main current can be determined by $I_{DS, M} = I_{DS, S} * n$.

Figure 4:
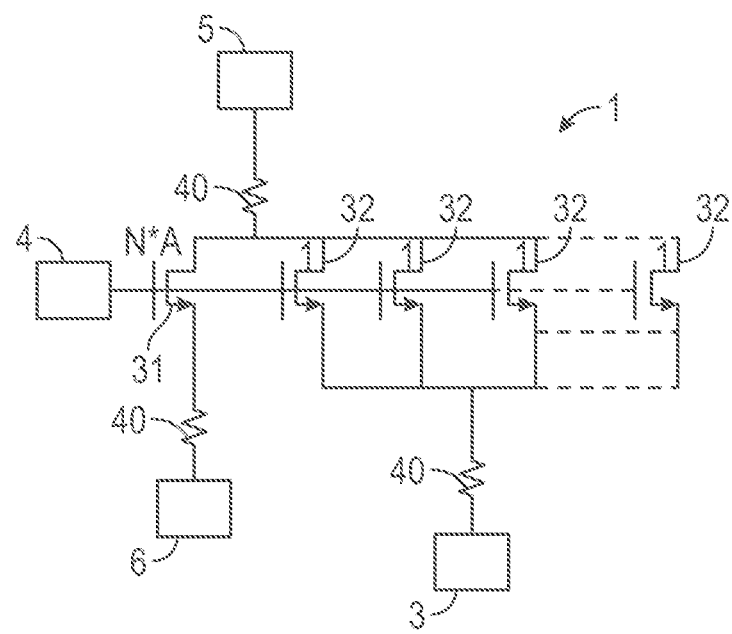
FIG. 4 shows the schematic circuit diagram of FIG. 3 with parasitic resistances.

As will be apparent from the above, a highly precise determination of $I_{DS, M}$ requires an exact sense ratio n to be known. As mentioned, the intrinsic sense ratio n is generally known from the setup of the integrated circuit, however, extrinsic (parasitic) resistances 40 may be more difficult to determine with high precision. FIG. 4 shows extrinsic resistances 40, which may in particular stem from connection (soldering) resistances and wire resistances.

Figure 5:
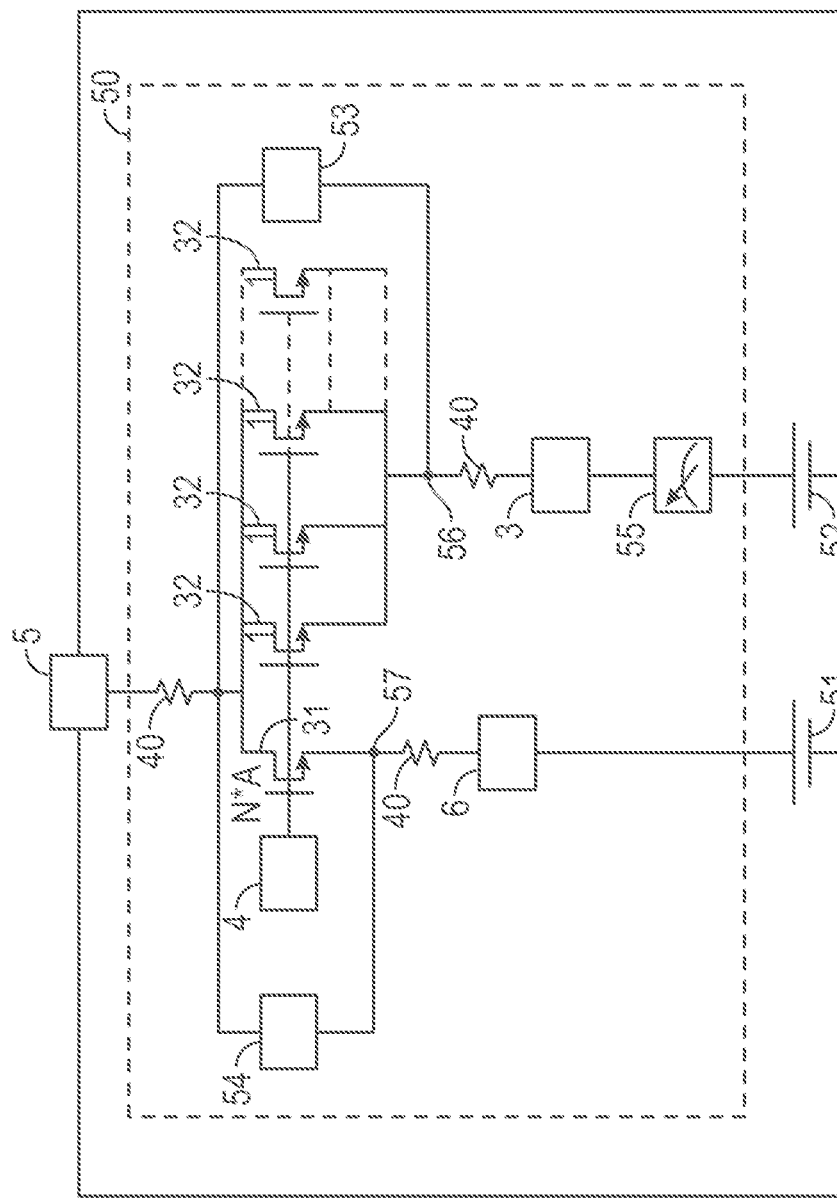
FIG. 5 shows a schematic circuit diagram of a further embodiment of an integrated circuit device.

FIG. 5 shows a further embodiment of an integrated circuit device 50 with external connections to a main power source 51 and a sense power source 52. The embodiment of FIG. 5 further shows voltage drive circuit 53, voltage measurement circuit 54, and current measurement circuit 55.

FIG. 5 also shows the aforementioned parasitic resistances 40. Voltage drive circuit 53 is connected between the common drain node 5 and a first kelvin voltage sensing node 56. Correspondingly, voltage measurement circuit 54 is connected between the common drain node 5 and a second kelvin voltage sensing node 57. The resulting setup corresponds to four-terminal sensing or kelvin sensing and has the advantage that since almost no current flows through the voltage drive circuit 53 and the voltage measurement circuit 54, the corresponding voltage drops are extremely small, increasing the accuracy of voltage control and measurement. Certainly, this requires that the voltage drive circuit 53 and the voltage measurement circuit 54 are of high impedance. Since the current flow between the voltage drive circuit 53 and the voltage measurement circuit 54 is almost zero and the resistance between these two points is very low in a common drain configuration as shown in FIG. 5, the voltage difference between sensing points 53 and 54 can be neglected.

The functionality of the embodiment of integrated circuit device 50 of FIG. 5 corresponds to the functionality, discussed in the preceding with reference to FIG. 3. During use, a main current is applied to the main transistor device 31 by main power source 51. The main current can be controlled by applying a control voltage to common gate node 4. Voltage measurement circuit 54 determines the voltage between the common drain node 5 and the second kelvin voltage sensing node 57. The result is transmitted to voltage drive circuit 53, which sets the voltage between common drain node 5 and a first kelvin voltage sensing node 56 to the voltage, applied to the main transistor device 31. Once the voltages over the transistor devices 31, 32 matches, the combined sensing current is determined by current measurement circuit 55. The current measurement circuit 55 determines the main current $I_{DS, M} = I_{DS, S} * n$. Note that in the present embodiment, current measurement circuit 55 is a galvanometer.

Figure 6:
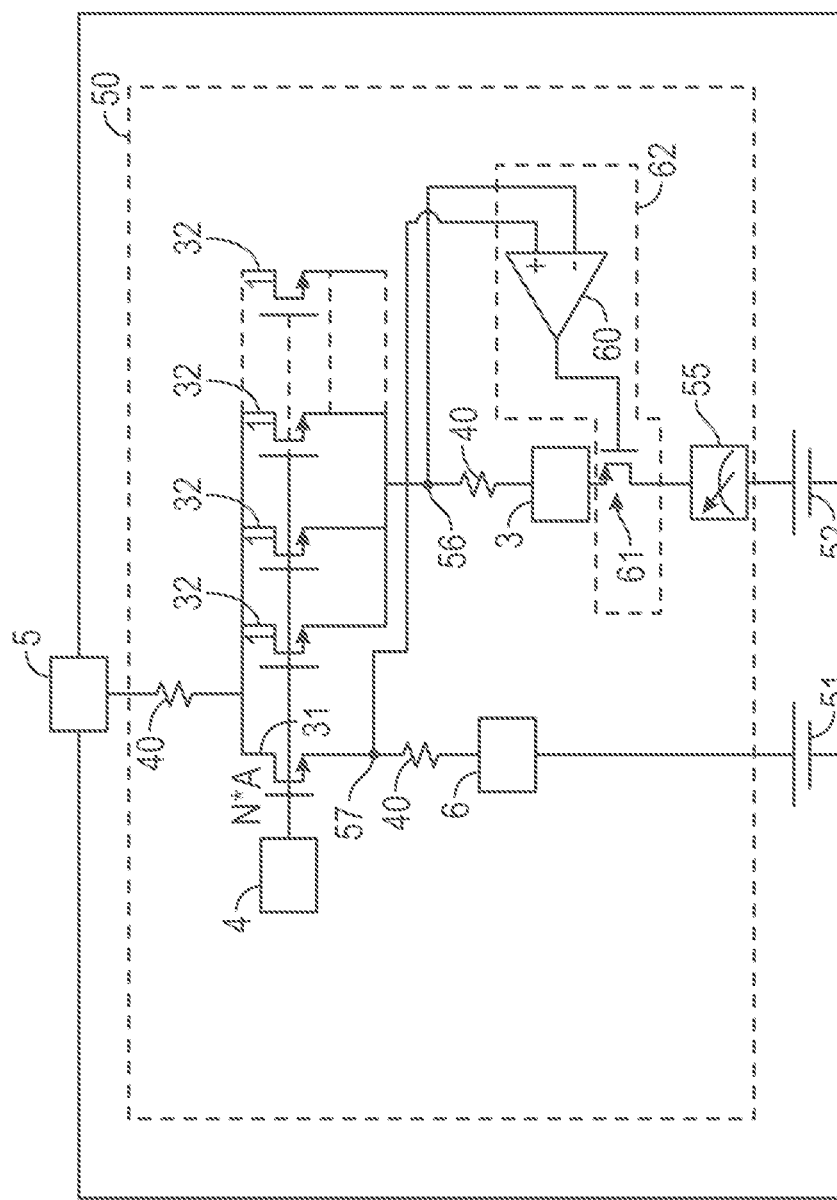
FIG. 6 shows schematic circuit diagram of yet another embodiment of an integrated circuit device.

FIG. 6 shows schematic circuit diagram of yet another embodiment of an integrated circuit device 50 with simplified sensing. The embodiment of FIG. 6 corresponds to the embodiment of FIG. 5, however voltage drive circuit 53 and voltage measurement circuit 54 have been replaced by voltage drive circuit 62, which comprises instrumentation amplifier 60 and PMOS transistor 61. Instrumentation amplifier 60 is used to control the voltage difference between the main transistor device 31 and the sensing transistor devices 32, i.e., between first kelvin sensing node 56 and second kelvin sensing node 57. Here it is assumed that the supply current (main+sense) current enters in terminal 5 while the main current flows out of terminal 6 and sense current flows out terminal 3. The voltage drive circuit 62 forces the voltage of node 56 to be equal to the voltage of node 57 independently of voltage drop on connection resistances 40. The current flowing into the sensing transistor devices 32 is transferred to the measurement circuit 55 (galvanometer or any other current sensing element) via PMOS (or PFET) transistor 61. Instrumentation amplifier 60 provides the appropriate gate drive voltage to transistor 61 in order to have the voltage of node 56 to be equal to the voltage of node 57. Since a MOS or FET transistor is used, the entire sensing current from devices 32 is transferred to the sensing galvanometer element 55. Using a bipolar transistor instead would require a base current compensation circuit, which certainly would be possible in another alternative embodiment.

As will be apparent from FIG. 6, an PMOS transistor 61 is used in order to make the sensing circuitry easy to understand. An NMOS transistor may be used instead, but in this case, the inverting and not inverting inputs of the instrumentation amplifier 60 should be swapped. Instrumentation amplifier 60 may be replaced by a chopper stabilized amplifier or an auto-zeroing amplifier in corresponding embodiments.

While the invention has been illustrated and described in detail in the drawings and foregoing description, such illustration and description are to be considered illustrative or exemplary and not restrictive; the invention is not limited to the disclosed embodiments. For example, it is possible to operate the invention in an embodiment in which:

instead of the transistor devices 31, 32/the elementary transistors 3, being connected to common drain node 5, transistor devices 31, 32/elementary transistors 3 are connected to a common source node and to separate main and sense drain nodes; and/or instead of the transistor devices 31, 32/the elementary transistors 3, being connected to common drain node 5, the transistor devices 31, 32/the elementary transistors 3 being connected to separate main and sense drain nodes.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor, module or other unit may fulfill the functions of several items recited in the claims.

The mere fact that certain measures are recited in mutually different dependent claims does not indicate that a combination of these measured cannot be used to advantage. Any reference signs in the claims should not be construed as limiting the scope.

What is claimed is:

1. An integrated circuit device for controlling and sensing electrical current, the integrated circuit device comprising
   a main transistor device, configured for controlling a main current; and
   a plurality of sensing transistor devices, configured for controlling a combined sensing current; wherein
   the main transistor device and the plurality of sensing transistor devices are connected to a common gate node;
   the on-state resistance of the main transistor device being lower than a combined on-state resistance of the plurality of sensing transistor devices;
   the sensing transistor devices are distributed throughout at least a section of the integrated circuit;
   the plurality of sensing transistor devices are connected in parallel to each other, so that a common sensing drain node and a common sensing source node are provided, wherein the common sensing drain node is connected to a main drain node of the main transistor device; and wherein
   the common sensing source node is configured as a first kelvin voltage sensing node and the integrated circuit further comprising a voltage drive circuit configured to set a measurement voltage between the first kelvin voltage sensing node and the common sensing drain node to a voltage across the main transistor device.

2. The integrated circuit device of claim 1, wherein the main transistor device is arranged in a transistor section of the integrated circuit device and the sensing transistor devices are distributed throughout at least the transistor portion.

3. The integrated circuit device of claim 2, wherein the sensing transistor devices are distributed evenly throughout at least the transistor section.

4. The integrated circuit device of claim 2, wherein the sensing transistor devices are equally spaced throughout at least the transistor section.

5. The integrated circuit device of claim 1, wherein the transistor section comprises a plurality of elementary transistors and wherein at least a first subset of the elementary transistors form the main transistor device and a plurality of second subsets of the elementary transistors form the plurality of sensing transistor devices.

6. The integrated circuit device of claim 1, wherein a sense ratio of an on-state resistance of the main transistor device to an on-state resistance of the plurality of sensing transistor devices is between 1:1000 and 1:10000.

7. The integrated circuit device of claim 1, comprising more than two sensing transistor devices.

8. The integrated circuit device of claim 1, wherein the main transistor device and the plurality of sensing transistor devices are connected to one or more of a common drain, a common source, and a main power source.

9. The integrated circuit device of claim 1, further comprising a voltage drive circuit configured to set a measurement voltage across the plurality of sensing transistor devices to a voltage across the main transistor device.

10. The integrated circuit device of claim 1, wherein the main transistor device comprises a main source node, said main source node being configured as a second kelvin voltage sensing node and the voltage drive circuit being configured to set the measurement voltage to a voltage between the second kelvin sensing node and the main drain node.

11. The integrated circuit device of claim 1, further comprising a measurement circuit, wherein the measurement circuit is configured for determining the combined sensing current.

12. The integrated circuit device of claim 11, wherein the measurement circuit is further configured to determine the main current from the combined sensing current and a predefined sense ratio.

13. A method for current measurement in an integrated circuit device, the integrated circuit device comprising a main transistor device and a plurality of sensing transistor devices, the plurality of sensing transistor devices being distributed throughout at least a section of the integrated circuit, the main transistor device and the plurality of sensing transistor devices being connected to a common gate node; the plurality of sensing transistor devices are connected in parallel to each other, so that a common sensing drain node and a common sensing source node are provided, wherein the common sensing drain node is connected to a main drain node of the main transistor device; and the common sensing source node is configured as a first kelvin voltage sensing node; wherein
   a main current is applied to the main transistor device;
   a measurement voltage between the first kelvin voltage sensing node and the common sensing drain node is set to a voltage across the main transistor device;
   a combined sensing current, flowing through the plurality of sensing transistor devices is determined; and
   the main current is calculated from the combined sensing current and a predefined sense ratio.

14. The method of claim 13, wherein before the combined sensing current is determined, a measurement voltage across the plurality of sensing transistor devices is set to a voltage across the main transistor device.

15. An integrated circuit device for controlling and sensing electrical current, the integrated circuit device comprising
   a main transistor device, configured for controlling a main current; and
   a plurality of sensing transistor devices, configured for controlling a combined sensing current; wherein
   the main transistor device and the plurality of sensing transistor devices are connected to a common gate node;
   the on-state resistance of the main transistor device being lower than a combined on-state resistance of the plurality of sensing transistor devices;
   the sensing transistor devices are distributed throughout at least a section of the integrated circuit;
   the plurality of sensing transistor devices are connected in parallel to each other, so that a common sensing drain node and a common sensing source node are provided, wherein the common sensing source node is connected to a main source node of the main transistor device; and wherein
   the common sensing drain node is configured as a first kelvin voltage sensing node and the integrated circuit further comprising a voltage drive circuit configured to set a measurement voltage between the first kelvin voltage sensing node and the common sensing source node to a voltage across the main transistor device.

16. The integrated circuit device of claim 15, wherein the main transistor device comprises a main drain node, said main drain node being configured as a second kelvin voltage sensing node and the voltage drive circuit being configured to set the measurement voltage to a voltage between the second kelvin sensing node and the main source node.

17. A method for current measurement in an integrated circuit device, the integrated circuit device comprising a main transistor device and a plurality of sensing transistor devices, the plurality of sensing transistor devices being distributed throughout at least a section of the integrated circuit, the main transistor device and the plurality of sensing transistor devices being connected to a common gate node; the plurality of sensing transistor devices are connected in parallel to each other, so that a common sensing drain node and a common sensing source node are provided, wherein the common sensing source node is connected to a main source node of the main transistor device; and the common sensing drain node is configured as a first kelvin voltage sensing node; wherein a main current is applied to the main transistor device;

a measurement voltage between the first kelvin voltage sensing node and the common sensing source node is set to a voltage across the main transistor device;

a combined sensing current, flowing through the plurality of sensing transistor devices is determined; and the main current is calculated from the combined sensing current and a predefined sense ratio.

* * * * *